US011869611B2

(12) United States Patent
Hartz et al.

(10) Patent No.: US 11,869,611 B2
(45) Date of Patent: Jan. 9, 2024

(54) ADJUSTMENT TO TRIM SETTINGS BASED ON A USE OF A MEMORY DEVICE

(71) Applicant: Micron Technology, Inc., Boise, ID (US)

(72) Inventors: Ezra E. Hartz, Meridian, ID (US); Joseph A. De La Cerda, Boise, ID (US); Benjamin Rivera, Boise, ID (US); Bruce J. Ford, Meridian, ID (US); Nicolas Soberanes, Boise, ID (US); Christopher Moore, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/074,228

(22) Filed: Dec. 2, 2022

(65) Prior Publication Data

US 2023/0095397 A1 Mar. 30, 2023

Related U.S. Application Data

(62) Division of application No. 17/307,798, filed on May 4, 2021, now Pat. No. 11,521,694.

(51) Int. Cl.
| G11C 7/04 | (2006.01) |
| G11C 29/02 | (2006.01) |
| G11C 29/12 | (2006.01) |
| G11C 29/44 | (2006.01) |

(52) U.S. Cl.
CPC .............. *G11C 29/028* (2013.01); *G11C 7/04* (2013.01); *G11C 29/12015* (2013.01); *G11C 29/44* (2013.01)

(58) Field of Classification Search
CPC ........................................................ G11C 7/04
USPC ........................................................ 365/201
See application file for complete search history.

(56) References Cited

U.S. PATENT DOCUMENTS

| 7,826,265 | B2 | 11/2010 | Aritome |
| 10,109,351 | B2 | 10/2018 | Aritome |
| 10,388,385 | B2 | 8/2019 | Chen et al. |
| 10,503,431 | B2 | 12/2019 | Gorobets et al. |
| 2003/0227792 | A1* | 12/2003 | Marr ....................... G11C 11/39 365/175 |
| 2007/0080905 | A1* | 4/2007 | Takahara ............. G09G 3/3233 345/76 |
| 2015/0092488 | A1 | 4/2015 | Wakchaure et al. |
| 2017/0186472 | A1* | 6/2017 | Jan ....................... G11C 29/028 |

\* cited by examiner

*Primary Examiner* — Muna A Techane
(74) *Attorney, Agent, or Firm* — Brooks, Cameron & Huebsch, PLLC

(57) ABSTRACT

An apparatus can include an array of memory cells and control circuitry coupled to the array of memory cells. The control circuitry can be configured to store a number of trim settings and receive signaling indicative of a use of the array of memory cells. The control circuitry can be configured to determine an adjustment to the number of trim settings based at least in part on the signaling.

20 Claims, 6 Drawing Sheets

ADJUSTMENT TO TRIM SETTINGS BASED ON A USE OF A MEMORY DEVICE

PRIORITY INFORMATION

This application is a Divisional of U.S. application Ser. No. 17/307,798, filed May 4, 2021, the contents of which are included herein by reference.

TECHNICAL FIELD

Embodiments of the disclosure relate generally to computing systems, and more specifically, relate to determining adjustments to trim settings of a memory device based on a use of the memory device.

BACKGROUND

Trim settings can be stored on a memory device (e.g., a NAND memory device. The trim settings can be maintained in trim tables. Trim settings can include, but are not limited to, changes to voltage and/or timing settings used to perform various memory operations such as program (write) operations, erase operations, and read operations. Different trim settings can be used modify memory operations in response to errors occurring when other trim settings are used (e.g., an error occurs during power up of a NAND memory device). A trim table can be loaded to recover from errors during operation of a NAND memory device.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
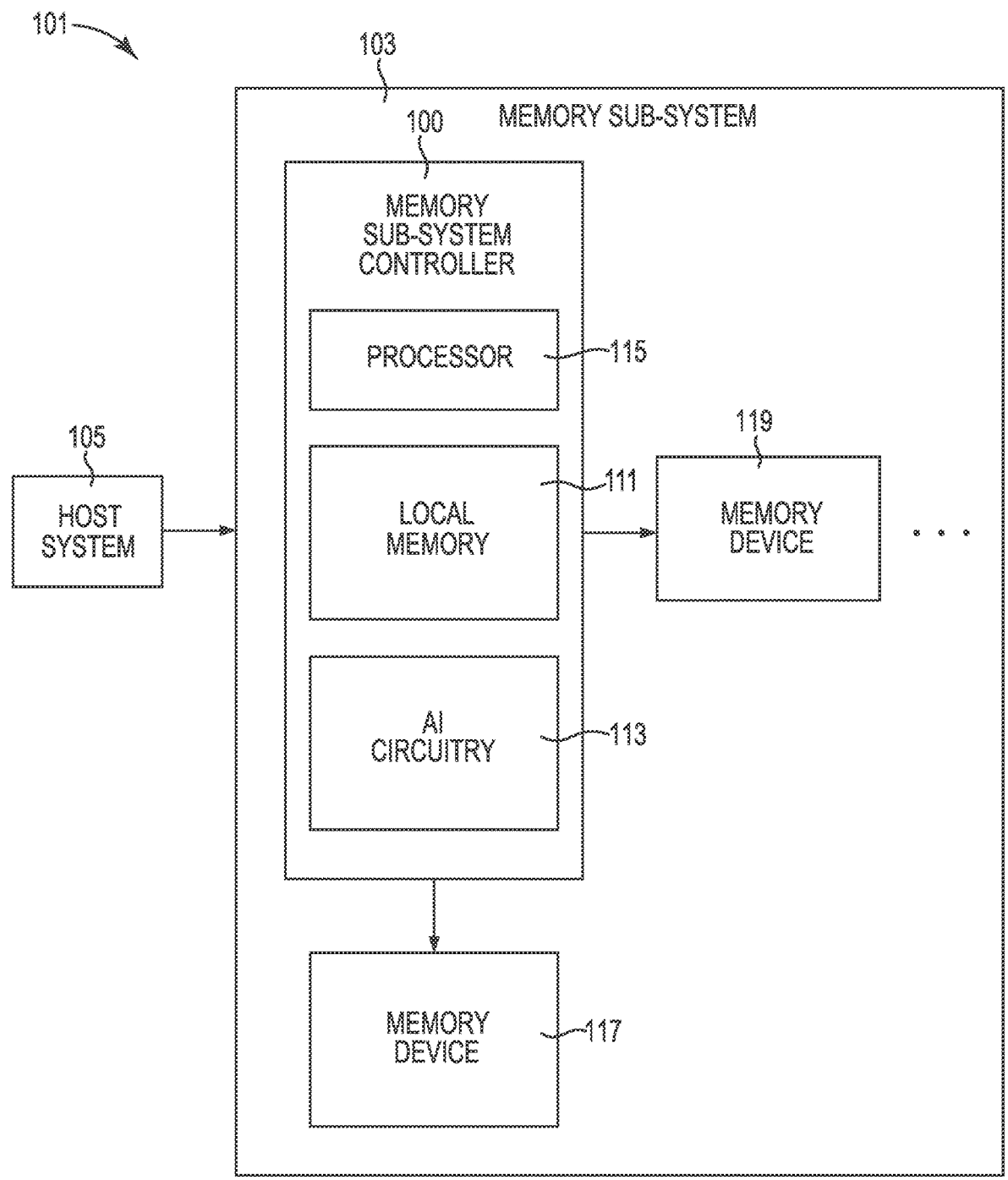
FIG. 1 illustrates an example computing system that includes a memory sub-system in accordance with some embodiments of the present disclosure.

At least one embodiments of present disclosure provides a controller and memory device (e.g., NAND array) storage a capability to determine and implement respective trims sets and/or trim tables that targeted at multiple use cases. As described herein, artificial intelligence (AI) can be employed to determine, during operation of a memory device, and implement trim settings based on how, when, where, and/or why the memory device is used and/or operated. In some embodiments, a controller coupled to a memory device has AI capabilities to determine trim settings dynamically (e.g., "on-the-fly") based on signaling indicative of how, when, where, and/or why the memory device is being used and/or operated. In some embodiments, a controller coupled to a memory device communicates with a remote server hosting AI capabilities to determine trim settings dynamically based on signaling, provided by the controller, indicative of how, when, where, and/or why the memory device is being used. As described herein, embodiments of the present disclosure provide flexibility and adaptability of trim settings not possible by previous approaches.

Previous approaches to operating a memory device with respect to programing trims, timings, and/or voltages employed by a memory device are limited. For example, a memory device may be provided with a single set of programing trims, timings, and/or voltages to employ for the life of the memory device. Because of this limitation, a memory device may not be optimized to account for one or more particular use cases of the memory device. A use case for a memory device can be referred to, herein, as use of a memory device. Use cases for a memory device can be characterized by factors internal to the memory device and/or factors external to the memory device. For example, a use case can be characterized by the environment in which the memory device operates. Non-limiting examples of external, environmental factors of a use case include exposure of a memory device to high or low temperatures, humidity, and vibration/shock. A use case can be characterized by how a memory device is used. Non-limiting examples of internal factors of a use case that are driven by how a memory device is used can include performance goals of the memory device, throughput of the memory device, length of life of the memory device, anticipated program erase cycles of the memory device, data retention of the memory device, and reliability.

Some previous approaches include providing predetermined trim settings based on a predetermined use case. Such predetermined trim settings can be set by a manufacturer of a memory device or by a user of the memory device at initial setup. These predetermined trim settings cannot be modified and do not provide the capability to tailor operation and/or performance of a memory device to satisfy changes in use cases. Performance of a memory device may be limited by using a single set of programming trim settings when use cases favor performance over life of the memory device and/or reliability of data. Some previous approaches may use a trim table to adjust trim settings (e.g., voltage and timing settings). For example, a trim table may be used to increase the speed of qualifying a controller of a memory device with a memory array of the memory device following an error by applying trim settings changes from a trim table rather than requalifying the memory array with the trim setting changes. Errors occurring during the life of a memory device may be recovered from applying trim setting changes from a trim table. Some previous approaches may include providing default trim settings to meet user specifications, but the default trim setting cannot be adjusted. Some previous approaches may include adding a trim table to cover corner cases identified during qualification or life of a memory devices. However, such previous approaches are limited to recovering from errors and/or improving the reliability of the memory device.

At least one embodiment of the present disclosure provides the ability to adjust trim settings of a memory device not provided by previous approaches. At least one embodiment enables a trim table stored by a memory device (e.g., stored on a controller and/or a memory array) to be updated dynamically. The trim table can be controlled by AI circuitry, external data sources, and/or machine learning to adjust trim settings of the memory device to account for multiple use cases of the memory device. As used herein, "external data sources" refer to repositories of data associated with types of memory devices and/or uses of memory devices. Non-limiting uses of a memory device include improving performance of the memory device, increasing reliability of the memory device, supporting operation of the memory device when subjected to extreme temperature, and lengthening the life of the memory device.

AI circuitry can be configured to combine data using iterative processing and algorithms such that the AI circuitry learns from patterns and/or features in the data. A non-limiting example of AI circuitry can be a neural network. As used herein, "neural network" refers to software, hardware, or combinations thereof configured to process data in a manner similar to neurons of a human brain. Artificial neural networks can include various technologies such as deep learning and machine learning. As used herein, "machine learning" refers to an ability software, hardware, or combinations thereof to learn and improve from experience without improvements being explicitly programmed. As used herein, "deep learning" refers to machine learning methods based on artificial neural networks with representation learning, which can be supervised, semi-supervised or unsupervised.

At least one embodiment of the present disclosure includes determining a trim setting for a memory device based on a use of the memory device (e.g., a use case). A use case for a memory device can be described, for example, by an environment in which the memory device is operated. A use case for a memory device can be described by one or more performance goals of the memory device such as throughput, life of the memory device, program erase cycles, data retention, and reliability. At least one embodiment can utilize AI circuitry, external data sources, and/or machine learning to determine a trim setting based on a use case for a memory device. The AI circuitry can be a component of the memory device (e.g., control circuitry of the memory device). The memory device can communicate with a server (e.g., a cloud server) hosting AI circuitry, external data sources, and/or machine learning.

At least one embodiment can include analyzing trim settings adjustments to characterize tradeoffs of adjusting voltage and/or timing settings to modify program time, data retention, read time, reliability, read disturbs, cross temperature support, and/or program/erase cycling capacity, for example. In at least one embodiment, the AI circuitry can perform an analysis of default trim settings of the memory device and subsequently determine additional trim settings to improve the performance and/or reliability of the memory device. The AI circuitry can update default trim settings for a particular die of the memory device based on volume production data, such as manufacturing data, testing data, and measurements taken during manufacturing, and/or trends for the die and wafer traits of the die. This can enable respective trim tables associated with each die or a group of dies of a memory device to be optimized dynamically (e.g., updated live) during operation of the memory device.

In at least one embodiment, AI circuitry can determine a trend of a use case for a memory device and requirements of the memory device associated with the trend of use. The AI circuitry can determine a trim setting of the memory device to adjust to satisfy the determined requirements. For example, the AI circuitry can monitor an operating temperature of the memory device to determine a trim setting to adjust to improve performance of the memory device at the operating temperature.

In at least one embodiment, AI circuitry can monitor storage of data in a memory array of the memory device. User profiles can be created, by the AI circuitry, based on screen time, application type, and storage time, for example. The user profiles can be indictive of respective uses of the memory device and trim setting adjustments can be associated with each user profile. The AI circuitry can identify which type of data is stored on the memory device for longer amounts of time. The AI circuitry can employ a flag system in which flag data is stored with user data. The flag data can be indicative of a type of the user data. The flag data can be read to predict if the length of storage time of the user data on the memory device.

In at least one embodiment, AI circuitry can determine trim setting adjustments to account for issues caused by manufacturing process shifts. For example, the AI circuitry can determine a trim setting adjustment to improve a low reliability of the memory device caused by a manufacturing process shift.

In at least one embodiment, AI circuitry can monitor a bit error rate (BER) of a memory device (per page, byte, block, etc.). The AI circuitry can adjust trim settings of the memory device to overcome increased BERs over the life of the memory device or high BERs in particular blocks, pages, or bytes of the memory device.

At least one embodiment can include determining an adjustment to a trim setting based on a use case for a memory device and update a trim table stored on the memory device accordingly. Non-limiting examples of adjustments to a trim setting based on a use case for a memory device follow. If AI circuitry determines that particular data is read from the memory device frequently, then a trim setting can be adjusted to reduce read disturbs when reading the data. If AI circuitry determines that an operating temperature of a memory device is extremely low or extremely high, then a trim setting can be adjusted to improve the performance (e.g., reliability) of the memory device at that operating temperature. If AI circuitry determines that particular data stored on the memory device will be read infrequently, then a trim setting can be adjusted so that the data is written to the memory device quickly but with reduced reliability. If AI circuitry determines that a memory device is frequently subjected to a cross temperature event, then a trim setting can be adjusted to improve reliability of write operations performed by the memory device. If AI circuitry determines that particular data is stored on a memory device for long periods of time, then a trim setting can be adjusted to increase reliability. If AI circuitry determines that retention of a memory device is low, then a trim setting can be adjusted to improve performance of the memory device.

In at least one embodiment, AI circuitry can determine a trim setting adjustment to achieve a desired life of a memory device. For example, the AI circuitry can determine an adjustment to a trim table (e.g., an adjustment to a trim setting maintained in a trim table) to improve performance of the memory device, which may decrease the life of the memory device, if a short life is desired (or a longer life is not desired). Conversely, the AI circuitry can determine an adjustment to a trim table to improve reliability and/or retention of the memory device, which may reduce performance of the memory device, if a longer life of the memory device is desired. A desired length of a life of a memory device can be based on user inputs. The AI circuitry can determine a desired life of the memory device based on the use case for the memory device. For example, if the AI circuitry determines that performance of the memory device is consistently high, then the AI circuitry can determine that a short life is desired (or a longer life is not desired).

The figures herein follow a numbering convention in which the first digit or digits correspond to the drawing figure number and the remaining digits identify an element or component in the drawing. For example, 119 may reference element "19" in FIG. 1, and a similar element may be referenced as 219 in FIG. 2. Analogous elements within a figure may be referenced with a hyphen and extra numeral or letter. Such analogous elements may be generally referenced without the hyphen and extra numeral or letter. For example, elements 347-1, . . . , 347-N in FIG. 3 may be collectively referenced as 347. As used herein, the designator "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates an example computing system 101 that includes a memory sub-system 103 in accordance with some embodiments of the present disclosure. The memory sub-system 103 can include media, such as one or more volatile memory devices 117, one or more non-volatile memory devices 119, or a combination thereof. The volatile memory devices 117 can be, but are not limited to, random access memory (RAM), such as dynamic random access memory (DRAM), synchronous dynamic random access memory (SDRAM), and resistive DRAM (RDRAM).

The memory sub-system 103 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 101 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 101 includes a host system 105 that is coupled to one or more of the memory sub-systems 103. In some embodiments, the host system 105 is coupled to different types of the memory sub-systems 103. FIG. 1 illustrates an example of a host system 105 coupled to a single memory sub-system 103. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 105 includes or is coupled to processing resources, memory resources, and network resources. As used herein, "resources" are physical or virtual components that have a finite availability within the computing system 101. For example, the processing resources include a processing device, the memory resources include the memory sub-system 103 for secondary storage and main memory devices (not specifically illustrated) for primary storage, and the network resources include as a network interface (not specifically illustrated). The processing device can be one or more processor chipsets, which can execute a software stack. The processing device can include one or more cores, one or more caches, a memory controller (e.g., NVDIMM controller), and a storage protocol controller (e.g., PCIe controller, SATA controller, etc.). The host system 105 can use the memory sub-system 103, for example, to write data to the memory sub-system 103 and/or read data from the memory sub-system 103.

The host system 105 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open not-and (NAND) Flash Interface (ONFI), Double Data Rate (DDR), Low Power Double Data Rate (LPDDR), or any other interface. The physical host interface can be used to transmit data between the host system 105 and the memory sub-system 103. The host system 105 can further utilize an NVM Express (NVMe) interface to access the non-volatile memory devices 119 when the memory sub-system 103 is coupled with the host system 105 by the PCIe interface. The physical host interface can provide an interface for passing control, address, data, and other signals between the memory sub-system 103 and the host system 105. The host system 105 can access multiple memory sub-systems via a same communication connection, multiple separate communication connections, and/or a combination of communication connections.

The host system 105 can send requests to the memory sub-system 103, for example, to store data on the memory sub-system 103 and/or to read data from the memory sub-system 103. The data to be written or read, as specified by a host request, can be referred to as "host data." A host request can include logical address information. The logical address information can be a logical block address (LBA), which may include or be accompanied by a partition number. The logical address information is the location the host system associates with the host data. The logical address information can be part of metadata for the host data. The LBA may also correspond (e.g., dynamically map) to a physical address, such as a physical block address (PBA), that indicates the physical location where the host data is stored in memory.

An example of non-volatile memory devices 116 include NAND type flash memory. NAND type flash memory includes, for example, two-dimensional NAND (2-D NAND) and three-dimensional NAND (3-D NAND). The non-volatile memory devices 119 can be other types of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), and 3-D cross-point memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the non-volatile memory devices 119 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the non-volatile memory devices 119 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the non-volatile memory devices 119 can be grouped as pages that can refer to a logical unit of the memory device used to store data. With some types of memory (e.g., NAND), pages can be grouped to form blocks.

The memory sub-system controller 100, which can be referred to as the controller 100 for simplicity, can communicate with the non-volatile memory devices 119 to perform operations such as reading data, writing data, erasing data, and other such operations at the non-volatile memory devices 119. The controller 100 can include hardware such as one or more integrated circuits and/or discrete components, a buffer memory, or a combination thereof. The hardware can include a digital circuitry with dedicated (i.e., hard-coded) logic to perform the operations described herein. The controller 100 can be a microcontroller, special purpose logic circuitry (e.g., a field programmable gate array (FPGA), an application specific integrated circuit (ASIC), etc.), or other suitable circuitry.

The controller 100 can include a processing device 115 (e.g., a processor) configured to execute instructions stored in a local memory 111. In the illustrated example, the local memory 111 of the controller 100 is an embedded memory configured to store instructions for performing various processes, operations, logic flows, and routines that control operation of the memory sub-system 103, including handling communications between the memory sub-system 103 and the host system 105.

In some embodiments, the local memory 111 can include memory registers storing memory pointers, fetched data, etc. The local memory 111 can also include ROM for storing micro-code, for example.

In general, the controller 100 can receive information or operations from the host system 105 and can convert the information or operations into instructions or appropriate information to achieve the desired access to the non-volatile memory devices 119 and/or the volatile memory devices 117. The controller 100 can be responsible for other operations such as wear leveling operations, error detection and/or correction operations, encryption operations, caching operations, and address translations between a logical address (e.g., LBA) and a physical address (e.g., physical block address) associated with the non-volatile memory devices 119. The memory sub-system controller 100 can further include host interface circuitry (not shown) to communicate with the host system 105 via the physical host interface. The host interface circuitry can convert a query received from the host system 105 into a command to access the non-volatile memory devices 119 and/or the volatile memory devices 117 as well as convert responses associated with the non-volatile memory devices 119 and/or the volatile memory devices 117 into information for the host system 105.

In at least one embodiment, the controller 100 can include AI circuitry 113. The AI circuitry 113 can be configured to determine adjustments to trim settings of the non-volatile memory devices 119 and/or the volatile memory devices 117 as described herein. For example, the controller 100 can be store a number of trim settings (in the local memory 111, for example). The AI circuitry 113 can receive signaling indicative of a use case for the non-volatile memory devices 119 and/or the volatile memory devices 117. The AI circuitry 113 can determine an adjustment to the number of trim settings based at least in part on the use case for the non-volatile memory devices 119 and/or the volatile memory devices 117.

Although FIG. 1 illustrates the AI circuitry 113 as a component of the controller 100, in at least one embodiment the AI circuitry can be external to the controller 100 or the memory sub-system 103. For instance, as described in association with FIG. 3, the AI circuitry can be hosted on a remote server (e.g., a cloud server).

Figure 2:
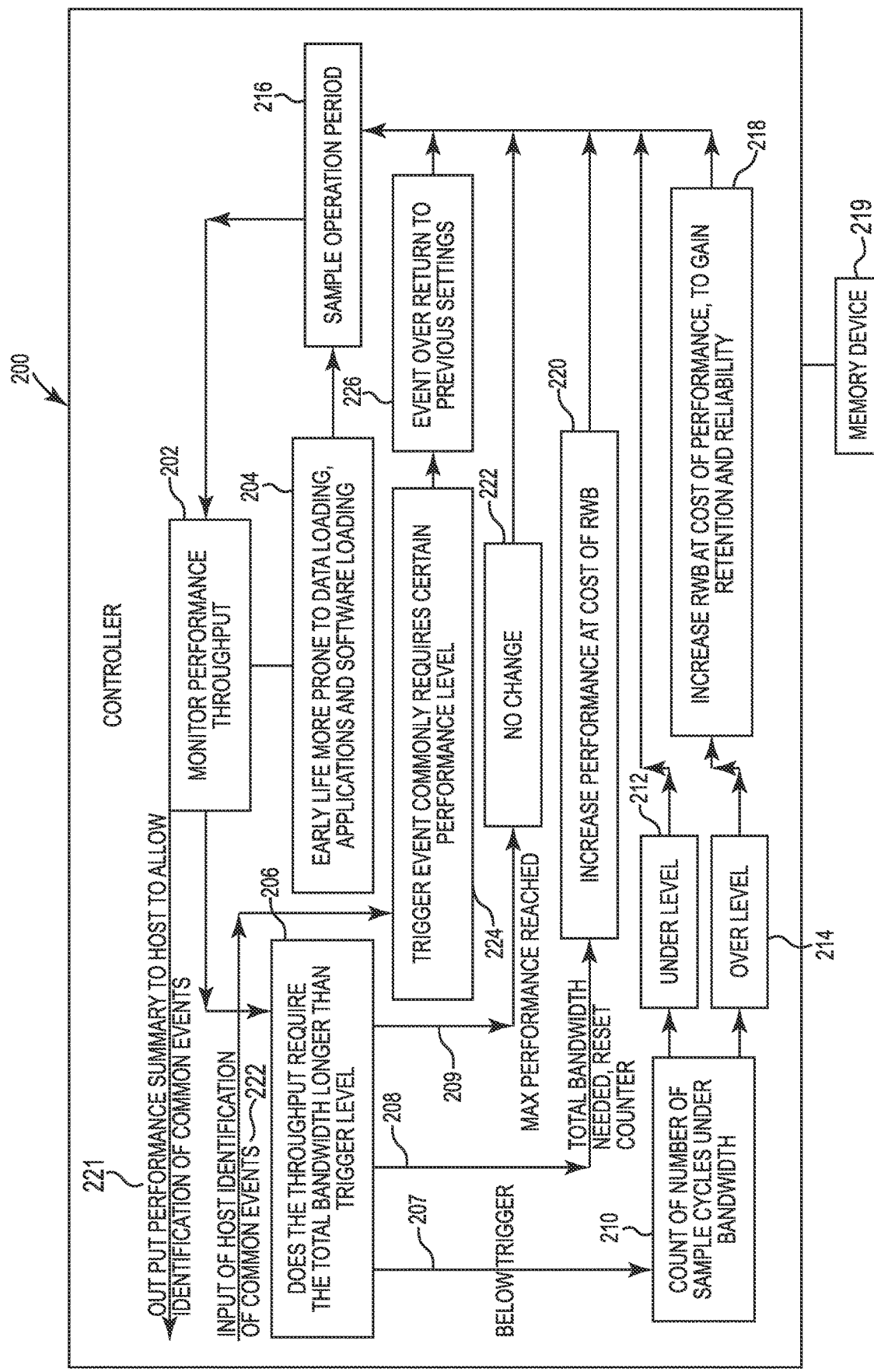
FIG. 2 is a flow diagram representative of determining, via artificial intelligence (AI) circuitry of a controller of a memory device, trim settings based on a use case for the memory device.

FIG. 2 is a flow diagram representative of determining, via AI circuitry of a controller 200 of a memory device, trim settings based on a use case for the memory device 219. The memory device 219 and the controller 200 can be components of a memory sub-system, such as the memory sub-system 103 described in association with FIG. 1. The controller 200 can be analogous to the controller 100. Although FIG. 2 illustrates the controller 200 determining trim settings using AI circuitry of the controller 200, embodiments of the present disclosure are not so limited. For example, the controller 200 can communicate with AI circuitry hosted remotely (such as on a cloud server) to receive trim settings based on a use case for the memory device. Such an embodiment is described further in association with FIG. 3.

The controller 200 can receive signaling indicative of a use case for the memory arrays. As illustrated at 202, the controller 200 can monitor performance throughput of one or more memory arrays coupled to the controller 200. As illustrated at 204, early in the life of the memory device, increased data loading, application loading, and/or software loading can occur. For example, in embodiments where the memory device is a component of a mobile device (such as a mobile phone or a tablet device), initial use of the mobile device can include a user setting up the mobile device with data, software, and applications. Thus, the controller 200 can determine that no adjustments to trim settings are needed and continue to (at 202) monitor the performance throughput of the memory arrays. As illustrated at 216, the controller 200 can periodically monitor the performance throughput during a sample operation period.

As illustrated at 222, the controller 200 can receive, from a host device (not shown) coupled to the memory device, for example, signaling indicative of events that frequently occur on the memory arrays (and/or events to which the memory arrays are frequently subjected). As illustrated at 221, the controller 200 can provide, to the host device, for example, signaling indicative of the monitored performance throughput. The signaling indicative of the monitored performance throughput can be used to determine the frequently occurring events. The signaling can be indicative of a quantity of write operations performed by the controller 200 during a particular time period. As illustrated at 224, the controller 200 can identify, based on the signaling indicative of frequent events, a trigger event that frequently requires improved performance of the memory arrays. In response to the trigger event, the controller 200 can determine a trim setting adjustment to improve the performance accordingly as described herein. As illustrated at 226, subsequent to the trigger event, the controller 200 can adjust the trim setting to a previous value.

As illustrated at 206, the controller 200 can determine whether the performance throughput of the memory arrays requires the total bandwidth available for greater than a threshold amount of time (a trigger level). As illustrated at 207, if the performance throughput of the memory arrays requires the total bandwidth available for less than the threshold amount of time, then (at 210) the controller 200 can determine a quantity of operation periods (sample cycles) that the performance throughput does not require the total bandwidth. As illustrated at 212, if the quantity of operation periods is less than a threshold quantity of operation periods, then the controller 200 can continue to (at 202) monitor the performance throughput of the memory arrays. As illustrated at 214, if the quantity of operation periods is at least the threshold quantity of operation periods, then the controller 200 can adjust a trim setting of the memory array to improve retention and/or reliability of the memory arrays. As illustrated at 218, the controller 200 can increase a read window budget (RWB) to improve retention and/or reliability of the memory arrays. As used herein, "read window budget" refers to a difference in magnitude of different program verify voltages for different programmed states or a program verify voltage and an erase verify voltage for different data states. Increasing the RWB can negatively affect the performance of the memory arrays because increasing the RWB increases voltages needed to read and write data to and from the memory arrays.

As illustrated at 208, if the performance throughput of the memory arrays requires the total bandwidth available for at least the threshold amount of time, then (at 220) the controller 200 can adjust a trim setting to improve the performance of the memory arrays. As illustrated at 220, the controller 200 can decrease the RWB. Decreasing the RWB improves the performance of the memory arrays by reducing voltages needed to read and write data to and from the memory arrays. In response to determining that the performance throughput requires the total bandwidth available for at least the threshold amount of time, the quantity of operation periods that the performance throughput does not require the total bandwidth can be reset.

As illustrated at 209, if the controller 200 determines that the performance of the memory arrays has been improved as much as possible (no further trim setting adjustments can be made to improve the performance), then (at 222) no trim settings are adjusted. The controller 200 can continue to (at 202) monitor the performance throughput of the memory arrays.

Figure 3:
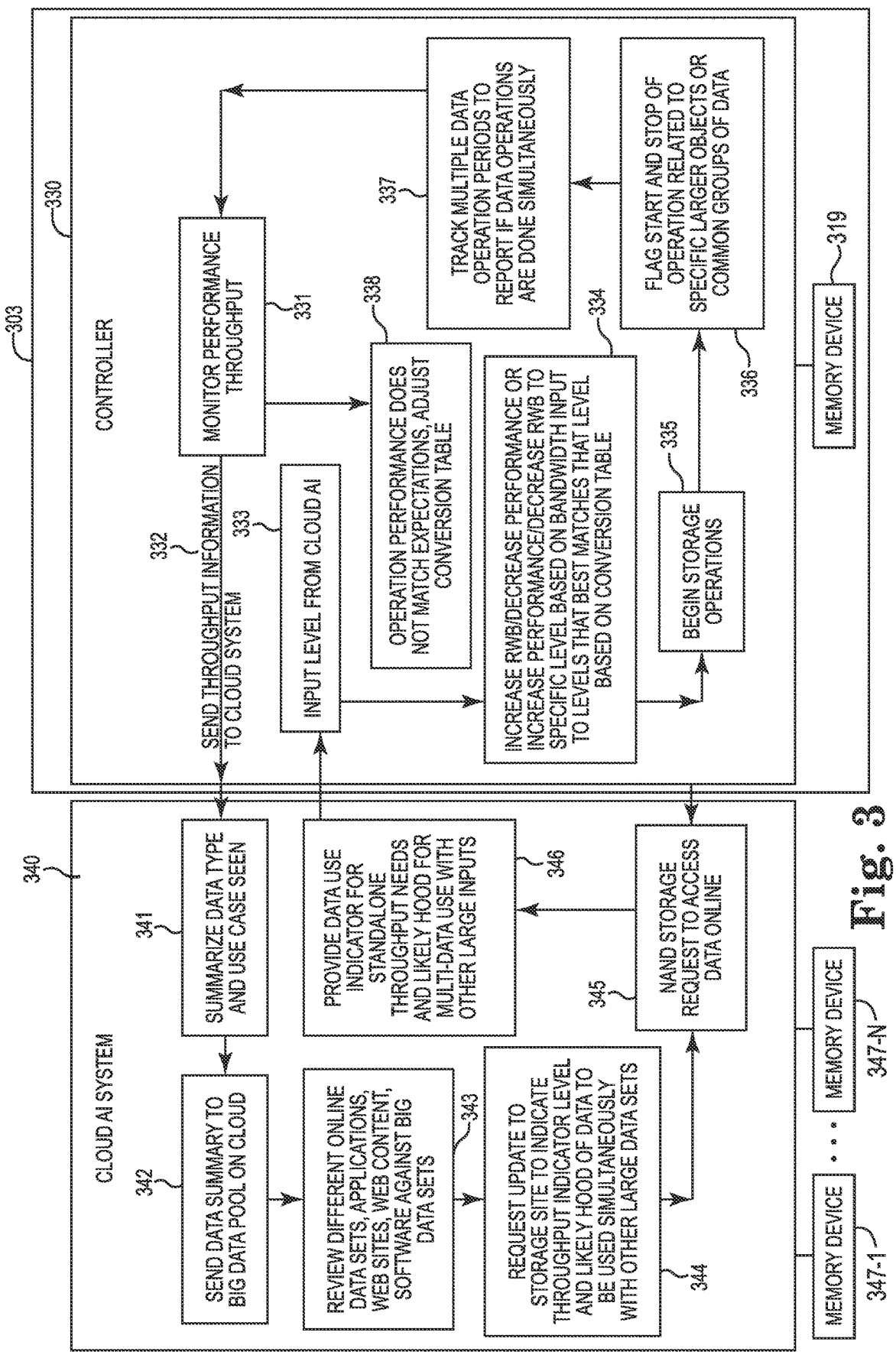
FIG. 3 is a flow diagram representative of determining, via AI circuitry of a remote server communicatively coupled to a controller of a memory device, trim settings based on a use case for the memory device.

FIG. 3 is a flow diagram representative of determining, via AI circuitry of a remote server 340 communicatively coupled to a controller 330 of a memory device 319, trim settings based on a use case for the memory device 319. The remote server 340 can be a cloud server hosting AI circuitry.

The controller 330 can be analogous to the controller 100 described in association with FIG. 1.

As illustrated at 331, the controller 330 can monitor performance throughput of one or more memory arrays coupled to the controller 330. As illustrated at 332, the controller 330 can provide signaling indicative of the monitored performance throughput to the AI circuitry hosted on the remote server 340. A host device (not shown) including the memory device 319 can provide signaling indicative of whether storage is needed. As illustrated at 341, the AI circuitry can identify, based on the signaling from the controller 330, types of data stored on the memory device 319. The AI circuitry can determine, based on the signaling from the controller 330, a use case for the memory device 319. In the example illustrated by FIG. 3, the use case fort the memory device 319 benefits from improved performance. However, embodiments of the present disclosure not limited to use cases that benefit from improved performance of the memory device 316.

As illustrated at 342, the AI circuitry can provide, to an external data sources pool, signaling indicative of types of data and/or use cases of the memory device identified by the AI circuitry. External data sources can include one or more storage locations for large quantities of data indicative of uses of different memory devices, such as memory devices 347-1, . . . , 347-N. For example, external data sources can include data indicative of associated with a particular type or model of memory device. External data sources can be provide AI circuitry a capability to consider previously determined trim settings based on a particular use case for a memory device (e.g., the memory device 347-1) when determining a trim setting for another memory device (e.g., the memory device 319) based on that particular use case for the other memory device. A trim setting that was previously determined to satisfy requirements associated with a particular use case for a memory device can be provided to another memory device to satisfy requirements associated with that particular use case.

As illustrated at 343, the AI circuitry 340 can review data sets, applications, web sites, web content, and/or software, which may be hosted on the Internet, associated with the memory device 319 and/or data stored on the memory device 319 and compare that information to data from the external data sources pool to determine the trim setting.

As illustrated at 344, the AI circuitry 340 can request an indication of the performance throughput of the memory device 319 from the controller 330. Based on the indication of the performance throughput of the memory device 319, the AI circuitry 340 can determine a likelihood of data stored by the memory device 319 to be used with large data sets.

As illustrated at 345, the controller 330 can request access to data stored by or accessible to the AI circuitry 340.

As illustrated at 346, the AI circuitry 340 can provide, to the controller 330, an indication of data use for standalone throughput and/or multi-data concurrent throughput. As used herein, "standalone throughput" refers to use of data on its own. As used herein, "multi-data concurrent throughput" refers to use of data concurrently with other data and/or concurrently with multiple applications. Multi-data concurrent throughput can require increased performance from a memory device than standalone throughput.

As illustrated at 333, the controller 330 can receive an input level from the AI circuitry 340. As illustrated at 334, the controller 330 can adjust a trim setting based on the input level from the AI circuitry 340. For example, the controller 330 can increase a RWB of the memory device 319 to improve retention and/or reliability of the memory device 319. Increasing the RWB can negatively affect the performance of the memory device 319 because increasing the RWB increases voltages needed to read and write data to and from the memory device 319. The controller 330 can decrease the RWB of the memory device 319 to improve the performance of the memory device 319 by reducing voltages needed to read and write data to and from the memory device 319.

As illustrated at 335, the controller 330 can perform storage operations (e.g., read operations, write operations) using the adjusted trim setting. As illustrated at 336, the controller 330 can flag a start and/or end of a storage operation involving a particular large file type, such as a video file, and/or groups of data that storage operations frequently involve as illustrated at 337, the controller 330 can determine whether operations are performed concurrently. As illustrated at 331, the controller 330 can continue to monitor performance throughput of the memory device 319. As illustrated at 338, in response to the controller 330 determining that the performance throughput is not as expected, the controller 330 adjust a conversion table.

Figure 4:
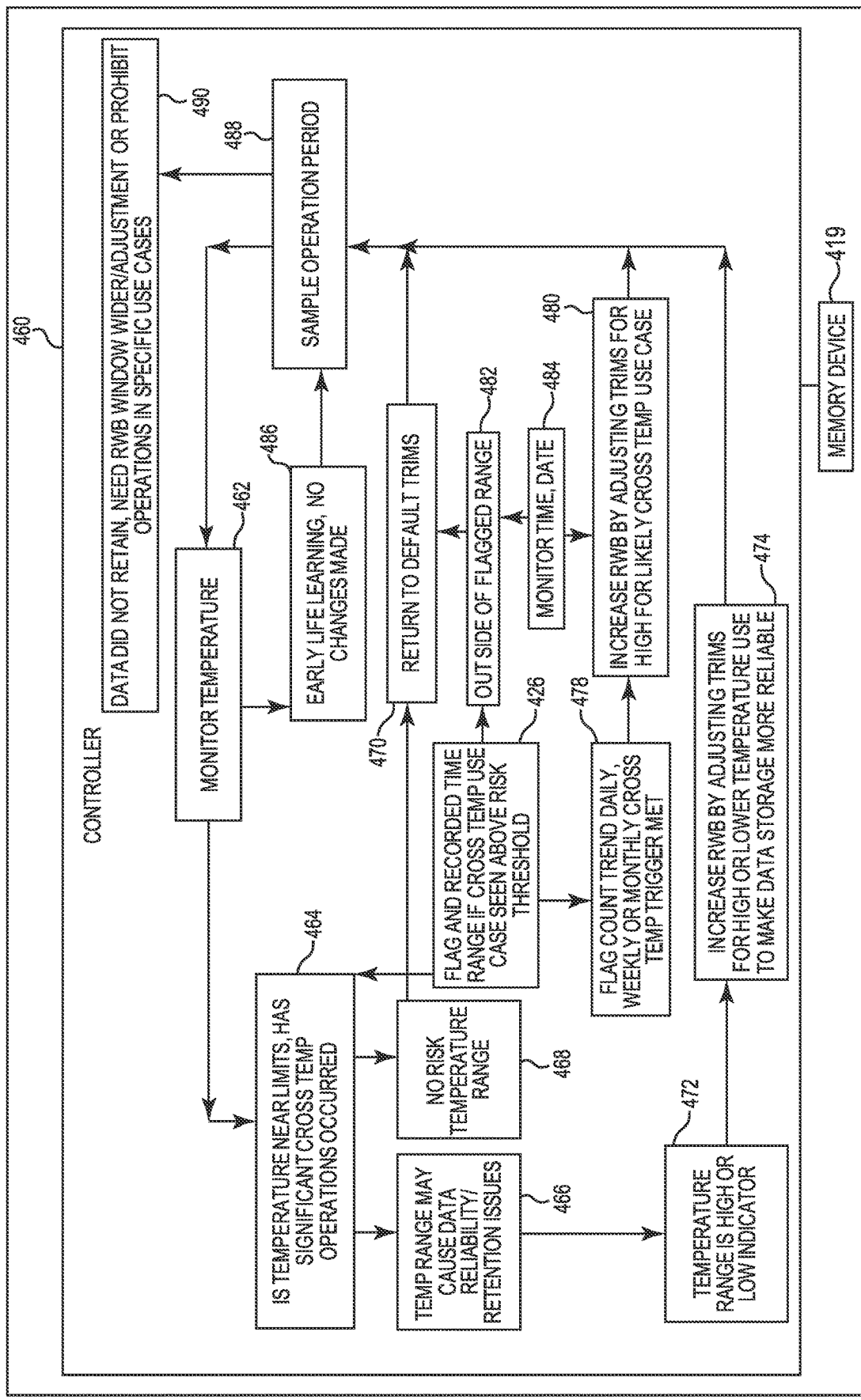
FIG. 4 is a flow diagram representative of determining, via AI circuitry of a controller of a memory device, trim settings based on a use case for the memory device.

FIG. 4 is a flow diagram representative of determining, via AI circuitry of a controller 460 of a memory device, trim settings based on a use case for the memory device. The AI circuitry can be analogous to the AI circuitry 113 described in association with FIG. 1. The controller 460 can be analogous to the controller 100. For clarity and ease of illustration, FIG. 4 does not illustrate the memory device. However, the memory device includes the controller 460 and at least one memory array coupled thereto. Although FIG. 4 illustrates the controller 460 determining trim settings using AI circuitry of the controller 460, embodiments of the present disclosure are not so limited. For example, the controller 460 can communicate with AI circuitry hosted remotely (such as on a cloud server) to receive trim settings based on a use case for the memory device.

As illustrated at 462, the controller 460 can monitor an operating temperature of one or more memory arrays coupled to the controller 460. The operating temperature can be affected by the environment in which the memory device is used. As illustrated at 486, early in the life of the memory device, trim settings may not be adjusted as the AI circuitry learns and monitors changes in the operating temperature.

As illustrated at 464, the controller 460 can determine whether the operating temperature exceeds a threshold operating temperature. The threshold operating temperature can be offset from a minimum operating temperature of the memory arrays or a maximum operating temperature of the memory arrays. For example, the threshold operating temperature can be a quantity of degrees less than the maximum operating temperature. The threshold operating temperature can be a quantity of degrees greater than the minimum operating temperature. The controller 460 can determine whether the memory device has undergone a cross temperature event.

As illustrated at 468, the controller 460 can determine that the operating temperature is such the performance of the memory device is not negatively affected by the operating temperature. As illustrated at 470, the controller 460 can return a trim setting that was previously adjust to a default value (e.g., reduce the RWB to a default RWB). As illustrated at 488, the controller 460 can continue to periodically monitor the operating temperature during a sample operation period.

As illustrated at 466, the controller 460 can determine that, based on whether the operating temperature exceeds the threshold operating temperature and/or the memory device has undergone a cross temperature event, the operating temperature may reduce reliability and/or retention of the memory arrays. As illustrated at 472, the controller 460 can provide an indication (to a host device, for example) that the operating temperature exceeds the threshold operating temperature. For example, the controller 460 can provide an indication that the operating temperature is high or low.

As illustrated at 474, the controller 460 can adjust a trim setting of the memory array to account for an operating temperature exceeding the threshold operating temperature and improve retention and/or reliability of the memory arrays. For example, the controller 460 can increase a RWB to improve retention and/or reliability of the memory arrays. As illustrated at 488, the controller 460 can continue to periodically monitor the operating temperature during a sample operation period.

As illustrated at 476, in response to determining that the memory device has undergone a cross temperature event that resulted in the operating temperature exceeding the threshold operating temperature, the controller 460 can store occurrence data associated with the cross temperature event. For example, the controller 460 can flag a time at which the cross temperature event occurred and/or an amount of time that the cross temperature event occurred.

As illustrated at 478, the controller 460 can flag and/or count the number of times that the memory device undergoes a cross temperature event within a particular amount of time (e.g., daily, weekly, monthly, etc.). As illustrated at 482 and 470, in response to determining that the memory device has undergone less than a threshold quantity of cross temperature events, the controller 460 can return a trim setting that was previously adjust to a default value (e.g., reduce the RWB to a default RWB).

As illustrated at 480, the controller 460 can adjust a trim setting of the memory array to account for the memory device undergoing a cross temperature event and improve retention and/or reliability of the memory arrays. For example, the controller 460 can increase a RWB to improve retention and/or reliability of the memory arrays.

As illustrated at 484, the controller 460 can monitor the time and/or date. In at least one embodiment, the controller 460 can receive an indication of the time and/or date external to the memory device, such as a host device. The controller 460 can anticipate a cross temperature event based on when (e.g., time of day) the memory device previously underwent a cross temperature event. The controller 460 can preemptively adjust a trim setting (e.g., increase the RWB) so that the performance (e.g., reliability, retention) of the memory arrays are not negatively affected by the anticipated cross temperature event. As illustrated at 488, the controller 460 can continue to periodically monitor the operating temperature during a sample operation period.

Figure 5:
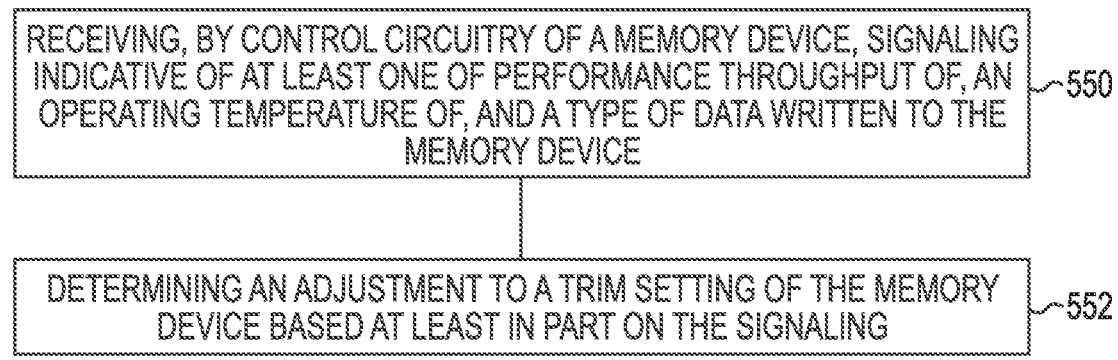
FIG. 5 is a flow diagram of an example method for operating a memory device accordance with some embodiments of the present disclosure.

FIG. 5 is a flow diagram of an example method for operating a memory device accordance with some embodiments of the present disclosure. The method can be performed by processing logic, for example, that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method can be performed by or using the memory sub-system controller 100, processing device 115, AI circuitry 113, and/or non-volatile memory device 119 and/or volatile memory device 117 described in association with FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 550 in the example method of FIG. 5, signaling indicative of performance throughput, an operating temperature, and/or a type of data written to a memory device (e.g., the non-volatile memory device 116) can be received by control circuitry (e.g., the controller 100) of the memory device.

In some embodiments, the signaling can be indicative of a date, a time, or a location of the memory device corresponding to a previous increase of the performance throughput of the memory device. An anticipated date, time, and/or location of a subsequent increase of the performance throughput of the memory device can be determined based on the signaling. The adjustment to the trim setting can be applied preemptively to the memory device at the anticipated date, time, or location of the subsequent increase of the performance throughput.

In some embodiments, the signaling can be indicative of a date, a time, or a location of the memory device corresponding to a previous change of the operating temperature of the memory device. An anticipated date, time, or location of a subsequent significant change of the operating temperature of the memory device can be determined based on the signaling. The adjustment to the trim setting can be applied preemptively applied to the memory device at the anticipated date, time, or location of the subsequent significant change of the operating temperature.

In some embodiments, the signaling can be indicative of a date, a time, or a location of the memory device corresponding to a previous writing of a particular type of data (e.g., video data) to the memory device. An anticipated date, time, or location of a subsequent writing of the particular type of data to the memory device can be determined based on the signaling. The adjustment to the trim setting can be applied preemptively to the memory device at the anticipated date, time, or location of the subsequent writing of the particular type of data to the memory device.

At block 552 in the example method of FIG. 5, an adjustment to a trim setting of the memory device can be determined based on the signaling, such as is described in association with FIGS. 2-4. Application metadata (as opposed to file system metadata) can be written with the video data within the second portion. The memory device can be operated to provide storage for a black box application executed by the host for a vehicle and the video data can be data from one or more cameras associated with the vehicle.

Figure 6:
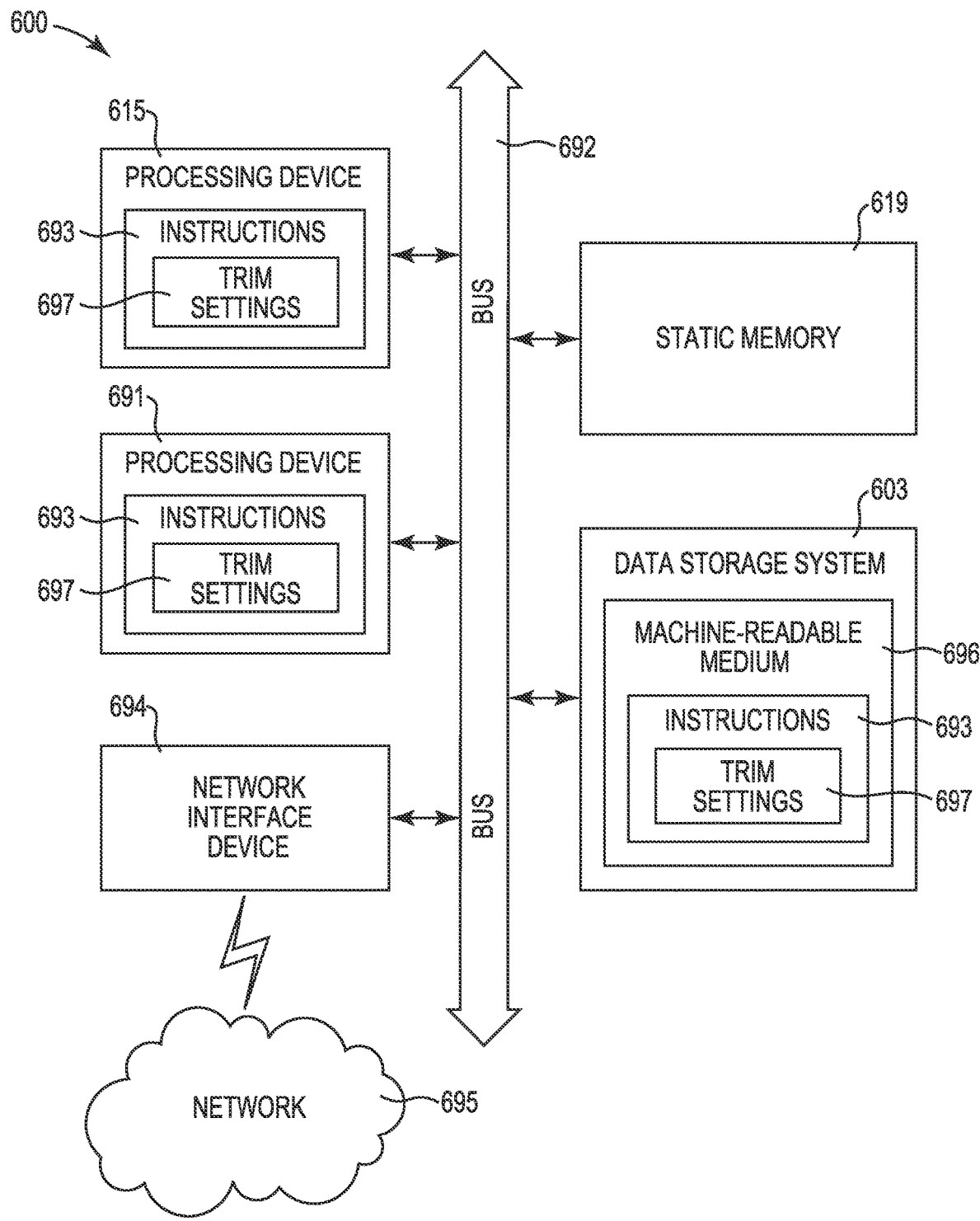
FIG. 6 is a block diagram of an example computer system in which embodiments of the present disclosure may operate.

FIG. 6 is a block diagram of an example computer system 601 in which embodiments of the present disclosure may operate. Within the computing system 601, a set of instructions, for causing a machine to perform one or more of the methodologies discussed herein, can be executed. The computing system 601 includes a processing device 615, a main memory 691, a static memory 619 (e.g., flash memory, static random access memory (SRAM), etc.), and a data storage system 603, which communicate with each other via a bus 692. The data storage system 603 can be analogous to the memory sub-system 103 described in association with FIG. 1.

The processing device 615 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 615 can also be one or more special-purpose processing devices such as an ASIC, an FPGA, a digital signal processor (DSP), network processor, or the like. The processing device 615 is configured to execute instructions 693 for performing the operations and steps discussed herein. The computing system 601 can further include a network interface device 694 to communicate over a network 695.

The data storage system 603 can include a machine-readable storage medium 696 (also known as a computer-readable medium) on which is stored one or more sets of instructions 693 or software embodying one or more of the methodologies or functions described herein. The instructions 693 can also reside, completely or at least partially, within the main memory 691 and/or within the processing device 615 during execution thereof by the computing system 603, the main memory 691 and the processing device 615 also constituting machine-readable storage media.

In some embodiments, the instructions 693 can include instructions to implement functionality corresponding to the AI circuitry 113 as described in association with of FIG. 1. For example, the instructions 691 can include trim setting instructions 697 to determine an adjustment to a trim setting of the static memory 619 based on a use case for the static memory 619. While the machine-readable storage medium 696 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
an array of memory cells; and
control circuitry coupled to the array of memory cells and configured to:
receive signaling indicative of an operating temperature of the array of memory cells;
determine whether the operating temperature is greater than a first threshold operating temperature;
determine whether the operating temperature is less than a second threshold operating temperature; and
responsive to determining that the operating temperature is greater than the first threshold operating temperature or less than the second threshold operating temperature, adjust a trim setting of the array of memory cells to improve performance of the array of memory cells.

2. The apparatus of claim 1, wherein the control circuitry is further configured to:
determine whether the array of memory cells has undergone a cross temperature event, wherein the cross temperature event comprises the operating temperature changing by at least a threshold quantity of degrees within a particular amount of time; and
responsive to determining that the array of memory cells has undergone the cross temperature event:
store occurrence data corresponding to the cross temperature event; and
adjust the trim setting to improve performance of the array of memory cells immediately subsequent to undergoing the cross temperature event.

3. The apparatus of claim 2, wherein the occurrence data is indicative of at least one of:
a date at which the array of memory cells underwent the cross temperature event;
a time at which the array of memory cells underwent the cross temperature event; and
a location at which the array of memory cells underwent the cross temperature event.

4. The apparatus of claim 2, wherein the occurrence data is indicative of a quantity of cross temperature events undergone by the array of memory cells.

5. The apparatus of claim 4, wherein the control circuitry is further configured to adjust the trim setting in response to the occurrence data being indicative of the array of memory cells undergoing at least a threshold quantity of cross temperature events.

6. The apparatus of claim 2, wherein the control circuitry is further configured to:
anticipate the array of memory cells undergoing another cross temperature event based at least in part on the occurrence data; and
preemptively adjust the trim setting prior to the other cross temperature event to improve the performance of the array of memory cells when undergoing the other cross temperature event.

7. The apparatus of claim 6, wherein the control circuitry is further configured to:
determine an anticipated date, time, or location of the other cross temperature event based at least in part on the occurrence data; and
adjust the trim setting at the anticipated time, date, or location.

8. The apparatus of claim 1, wherein the first threshold operating temperature is a first quantity of degrees less than a maximum operating temperature of the array of memory cells, and
wherein the second threshold operating temperature is a second quantity of degrees greater than a minimum operating temperature of the array of memory cells.

9. A method, comprising:
receiving, by control circuitry of a memory device, signaling indicative of:
performance throughput of the memory device;
an operating temperature of the memory device; and
a type of data written to the memory device; and
determining an adjustment to a trim setting of the memory device based at least in part on the signaling;
wherein the adjustment to the trim setting improves performance of the memory device in response to determining whether the operating temperature of the memory device is greater than a first threshold or less than a second threshold.

10. The method of claim 9, wherein the signaling is further indicative of a date, a time, or a location of the memory device corresponding to a previous increase of the performance throughput of the memory device, and wherein the method further comprises:
determining an anticipated date, time, or location of a subsequent increase of the performance throughput of the memory device based at least in part on the signaling; and
preemptively applying the adjustment to the trim setting to the memory device at the anticipated date, time, or location of the subsequent increase of the performance throughput.

11. The method of claim 9, wherein the signaling is further indicative of a date, a time, or a location of the memory device corresponding to a previous change of the operating temperature of the memory device, and wherein the method further comprises:
determining an anticipated date, time, or location of a subsequent significant change of the operating temperature of the memory device based at least in part on the signaling; and
preemptively applying the adjustment to the trim setting to the memory device at the anticipated date, time, or location of the subsequent significant change of the operating temperature.

12. The method of claim 9, wherein the signaling is further indicative of a date, a time, or a location of the memory device corresponding to a previous writing of a particular type of data to the memory device, and wherein the method further comprises:
determining an anticipated date, time, or location of a subsequent writing of the particular type of data to the memory device based at least in part on the signaling; and
preemptively applying the adjustment to the trim setting to the memory device at the anticipated date, time, or location of the subsequent writing of the particular type of data to the memory device.

13. An apparatus, comprising:
artificial intelligence (AI) circuitry communicatively coupled to a first memory device and a second memory device, wherein the AI circuitry is configured to:
determine a use case of the first memory device based on:
first signaling indicative of performance of the first memory device; and
second signaling indicative of an operating temperature of the first memory device;
determine an adjustment to a trim setting of the first memory device based on the determined use case; and
responsive to a determination that the second memory device undergoes the determined use case, provide third signaling indicative of the determined adjustment to the trim setting to the second memory device.

14. The apparatus of claim 13, wherein the operating temperature is a temperature relative to a threshold operating temperature.

15. The apparatus of claim 13, wherein the AI circuitry is further configured to determine the use case of the first memory device based on fourth signaling indicative of whether the first memory device underwent a cross temperature event.

16. The apparatus of claim 15, wherein the fourth signaling is further indicative of a date, a time, or a location at which the first memory device underwent the cross temperature event.

17. The apparatus of claim 15, wherein the AI circuitry is further configured to, responsive to a determination that the second memory device underwent the cross temperature event, provide the third signaling indicative of the determined adjustment to the trim setting to the second memory device.

18. The apparatus of claim 13, wherein the first signaling is further indicative of performance throughput of an array of memory cells of the first memory device.

19. The apparatus of claim 13, wherein the AI circuitry is further configured to determine the use case of the first memory device based on fourth signaling indicative of a type of data or a frequently written to the first memory device or a quantity of data frequently written to the first memory device during a respective write operation.

20. The apparatus of claim 13, wherein the AI circuitry is hosted on a remote server communicatively coupled to the first memory device and the second memory device.

* * * * *